US012588568B2

(12) United States Patent　　　(10) Patent No.:　US 12,588,568 B2
Kang　　　　　　　　　　　　　　(45) Date of Patent:　　Mar. 24, 2026

(54) SEMICONDUCTOR PACKAGE

(71) Applicant: SAMSUNG ELECTRONICS CO., LTD., Suwon-si (KR)

(72) Inventor: Tae-Ho Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 393 days.

(21) Appl. No.: 18/469,347

(22) Filed: Sep. 18, 2023

(65) Prior Publication Data

US 2024/0274582 A1　　Aug. 15, 2024

(30) Foreign Application Priority Data

Feb. 10, 2023　　(KR) ........................ 10-2023-0018317

(51) Int. Cl.
　　*H01L 25/065*　　(2023.01)
　　*H01L 23/00*　　(2006.01)
　　*H01L 23/31*　　(2006.01)
(52) U.S. Cl.
　　CPC .......... *H01L 25/0657* (2013.01); *H01L 24/06* (2013.01); *H01L 24/16* (2013.01); *H01L 24/32* (2013.01); *H01L 24/73* (2013.01); *H01L 23/3107* (2013.01); *H01L 24/96* (2013.01); *H01L 24/97* (2013.01);
　　　　　　　(Continued)
(58) Field of Classification Search
　　CPC ..... H01L 25/0657; H01L 24/06; H01L 24/16; H01L 24/32; H01L 24/73; H01L 23/3107; H01L 24/96; H01L 24/97; H01L 2224/06134; H01L 2224/16148; H01L 2224/32145; H01L 2224/73204; H01L 2224/96; H01L 2224/97; H01L 2225/06513; H01L 2225/06541; H01L 2924/3511; H01L 2224/02372; H01L 2225/06517; H01L 2225/06565; H01L 24/02; H01L 24/05; H01L 24/13; H01L 24/17; H01L 25/105; H01L 23/481; H01L 23/49816; H01L 23/5286; H01L 24/07; H01L 24/15; H01L 25/18; H01L 2224/023; H01L 2225/1041; H01L 2225/1058

See application file for complete search history.

(56) References Cited

U.S. PATENT DOCUMENTS 8,461,045 B2　　6/2013　Hsu et al.
8,525,333 B2 *　9/2013　Kanetaka .......... H01L 23/49816
　　　　　　　　　　　　　　　　　257/737
(Continued)

FOREIGN PATENT DOCUMENTS

CN　　104425422 A　*　3/2015　............. H01L 23/60
CN　　110867417 A　*　3/2020　............. H01L 24/19
(Continued)

*Primary Examiner* — Mohammed Shamsuzzaman
(74) *Attorney, Agent, or Firm* — Morgan, Lewis & Bockius LLP

(57)　　　　　　ABSTRACT

A semiconductor package includes a plurality of semiconductor chips stacked sequentially. Each semiconductor chip includes a substrate including a back surface and a front surface which are opposite to each other, a plurality of first back conductive pads disposed on the back surface, a plurality of second back conductive pads disposed on the back surface, and a redistribution pattern disposed on the back surface and disposed between the plurality of second back conductive pads.

16 Claims, 10 Drawing Sheets

(52) U.S. Cl.
CPC .............. *H01L 2224/06134* (2013.01); *H01L 2224/16148* (2013.01); *H01L 2224/32145* (2013.01); *H01L 2224/73204* (2013.01); *H01L 2224/96* (2013.01); *H01L 2224/97* (2013.01); *H01L 2225/06513* (2013.01); *H01L 2225/06541* (2013.01); *H01L 2924/3511* (2013.01)

(56) References Cited

U.S. PATENT DOCUMENTS

| | | | | |
|---|---|---|---|---|
| 9,368,460 | B2 | 6/2016 | Yu et al. | |
| 9,721,926 | B2 * | 8/2017 | Choe | H01L 24/06 |
| 10,756,042 | B2 | 8/2020 | Wagner | |
| 11,011,502 | B2 * | 5/2021 | Lee | H01L 24/19 |
| 11,222,873 | B2 * | 1/2022 | Jun | H01L 24/14 |
| 11,244,939 | B2 * | 2/2022 | Tsai | H01L 24/24 |
| 11,342,310 | B2 * | 5/2022 | Choi | H01L 24/83 |
| 2013/0256872 | A1 * | 10/2013 | Su | H01L 25/0657 |
| | | | | 257/737 |
| 2018/0076178 | A1 * | 3/2018 | Park | H01L 24/09 |
| 2021/0183756 | A1 * | 6/2021 | Chae | H01L 23/49822 |
| 2021/0183816 | A1 * | 6/2021 | Jun | H01L 25/0657 |
| 2021/0305226 | A1 * | 9/2021 | Tsai | H01L 23/295 |
| 2022/0077007 | A1 * | 3/2022 | Kim | H01L 23/3128 |
| 2022/0157780 | A1 | 5/2022 | Kwon et al. | |
| 2022/0165643 | A1 * | 5/2022 | Son | H01L 25/18 |
| 2022/0199529 | A1 * | 6/2022 | Kim | H01L 24/20 |
| 2023/0065405 | A1 * | 3/2023 | Huang | H01L 21/568 |

FOREIGN PATENT DOCUMENTS

| | | | | | |
|---|---|---|---|---|---|
| CN | 112992872 | A * | 6/2021 | ............. | H01L 21/56 |
| KR | 102360381 | B1 * | 2/2022 | ......... | H01L 23/3135 |
| TW | 202117997 | A * | 5/2021 | ........... | H01L 23/488 |
| TW | 202306092 | A * | 2/2023 | ....... | H01L 23/49816 |

* cited by examiner

FIG. 2

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0018317, filed on Feb. 10, 2023 in the Korean Intellectual Property Office, the disclosure of which is incorporated by reference herein in its entirety.

TECHNICAL FIELD

Embodiments of the inventive concept relate to a semiconductor package.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. Various techniques for increasing reliability and durability of semiconductor packages have recently been studied.

SUMMARY

Embodiments of the inventive concept may provide a semiconductor package with increased reliability.

In an embodiment, a semiconductor package may include a plurality of semiconductor chips stacked sequentially. Each semiconductor chip may include a substrate including a back surface and a front surface which are opposite to each other, a plurality of first back conductive pads disposed on the back surface, a plurality of second back conductive pads disposed on the back surface, and a redistribution pattern disposed on the back surface and disposed between the plurality of second back conductive pads.

In an embodiment, a semiconductor package may include a plurality of semiconductor chips stacked sequentially. Each semiconductor chip may include a substrate including a back surface and a front surface which are opposite to each other, a plurality of first back conductive pads disposed on the back surface, a plurality of second back conductive pads disposed on the back surface, a redistribution pattern disposed on the back surface and being in contact with at least two second back conductive pads of the plurality of second back conductive pads, and a through-via penetrating the substrate and being in contact with each of the first back conductive pads.

In an embodiment, a semiconductor package may include a plurality of semiconductor chips stacked sequentially, an underfill layer disposed between the semiconductor chips, and a mold layer covering the plurality of semiconductor chips. Each semiconductor chip may include a substrate including a back surface and a front surface which are opposite to each other, a plurality of first back conductive pads disposed on the back surface, a plurality of second back conductive pads disposed on the back surface, a redistribution pattern disposed on the back surface and being in contact with at least two second back conductive pads of the plurality of second back conductive pads, a through-via penetrating the substrate and being in contact with each of the first back conductive pads, a plurality of interconnection lines disposed on the front surface, an interlayer insulating layer covering the interconnection lines, a plurality of front conductive pads disposed under the interlayer insulating layer, and a plurality of internal connection members bonded to the front conductive pads. A width of the redistribution pattern may range from about 10% to about 300% of a width of at least one of the second back conductive pads. A thickness of the redistribution pattern may be about 5 μm or less. The width of the at least one of the second back conductive pads may range from about 10 μm to about 100 μm.

BRIEF DESCRIPTION OF THE DRAWINGS

The above and other features of the inventive concept will become more apparent by describing in detail embodiments thereof with reference to the accompanying drawings.

FIG. 2 is a cross-sectional view taken along a line I-I' of FIG. 1.

DETAILED DESCRIPTION

Figure 1:
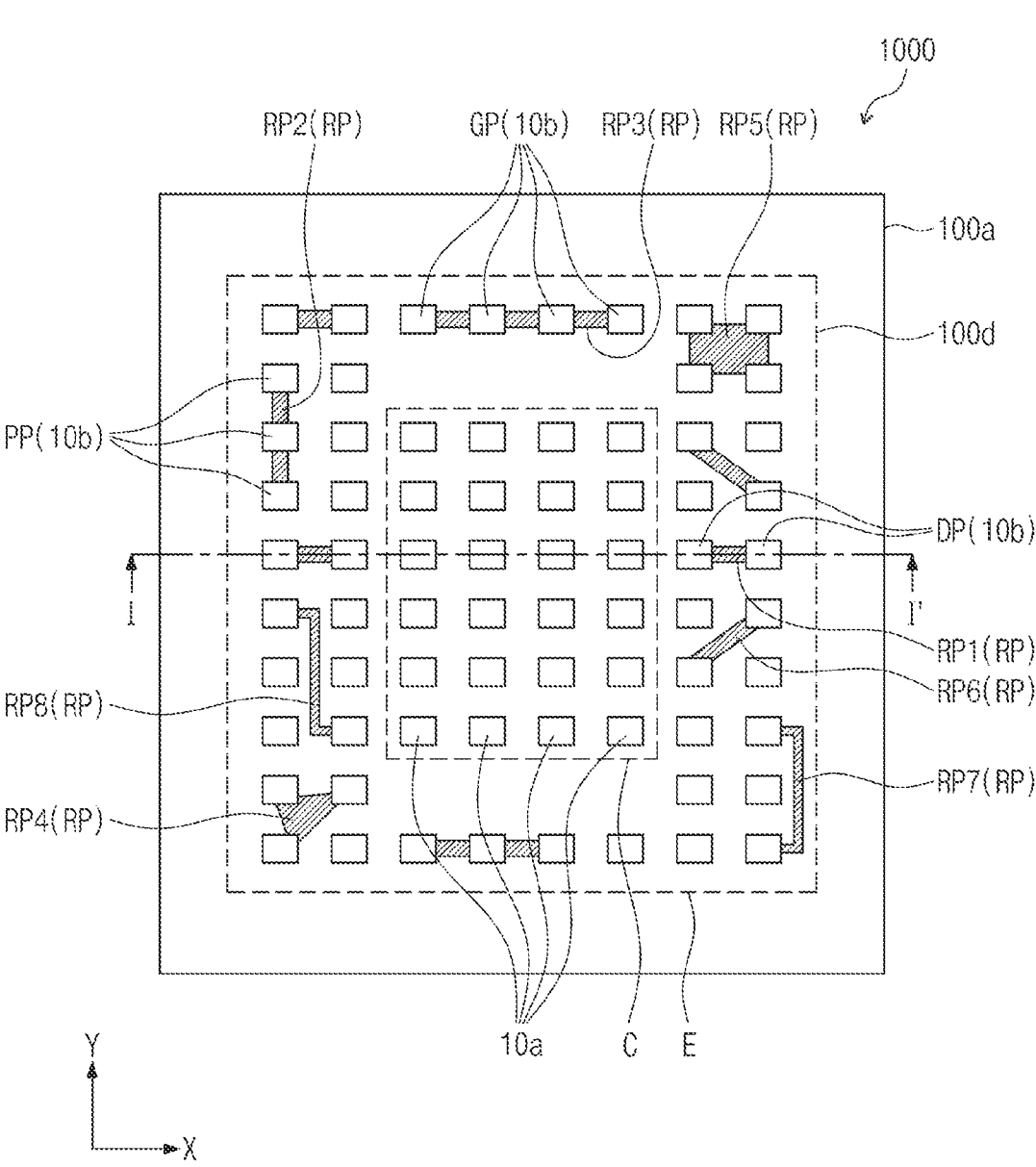
FIG. 1 is a plan view illustrating a semiconductor package according to some embodiments of the inventive concept.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
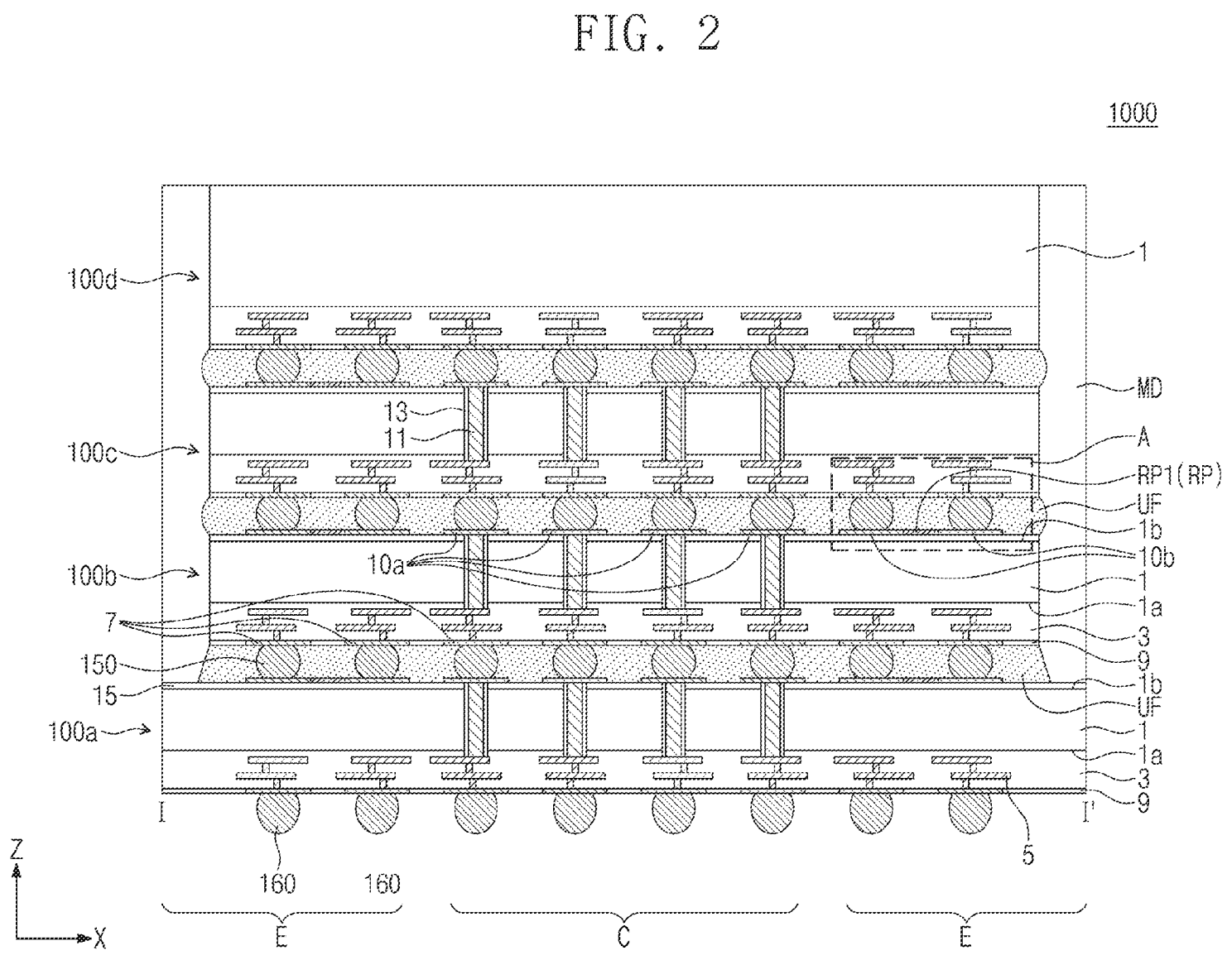
Figure 3:
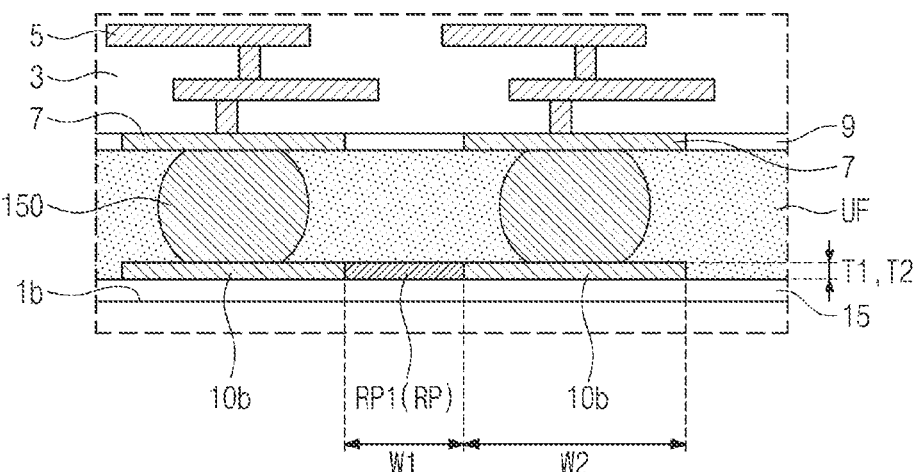
FIG. 3 is an enlarged view of a portion 'A' of FIG. 2.

FIG. 1 is a plan view illustrating a semiconductor package according to some embodiments of the inventive concept. FIG. 2 is a cross-sectional view taken along a line I-I' of FIG. 1. FIG. 3 is an enlarged view of a portion 'A' of FIG. 2.

Referring to FIGS. 1 to 3, a semiconductor package 1000 according to an embodiment may include first to fourth semiconductor chips 100a to 100d stacked sequentially, and a mold layer MD covering the first to fourth semiconductor chips 100a to 100d.

A width of the first semiconductor chip 100a may be greater than a width of each of the second to fourth semiconductor chips 100b, 100c and 100d. A type of the first semiconductor chip 100a may be different from a type of each of the second to fourth semiconductor chips 100b, 100c and 100d. For example, the first semiconductor chip 100a may be a logic circuit chip, and the second to fourth semiconductor chips 100b, 100c and 100d may be the same type of memory chip (e.g., DRAM chips). One logic circuit chip and three memory chips are stacked in an embodiment, but the numbers of the logic circuit chip and the memory chips are not limited thereto, and may be variously changed according to embodiments. The semiconductor package 1000 may have a high bandwidth memory (HBM) chip structure.

Each of the first to fourth semiconductor chips 100a to 100d may include a substrate 1, an interlayer insulating layer 3, interconnection lines 5, front conductive pads 7, a first passivation layer 9, and a second passivation layer 15. The substrate 1 may have a substrate front surface 1a and a substrate back surface 1b, which are opposite to each other. The interlayer insulating layer 3 may be disposed on the substrate front surface 1a. Transistors and multi-layered interconnection lines 5 may be disposed in the interlayer insulating layer 3. The interlayer insulating layer 3 may be covered with the first passivation layer 9. The front conductive pads 7 may be disposed under the interlayer insulating layer 3.

The substrate back surface 1b may be covered with the second passivation layer 15. A plurality of first back conductive pads 10a, a plurality of second back conductive pads

10b and a plurality of redistribution patterns RP may be disposed on the second passivation layer 15. The first back conductive pads 10a may be disposed in a central portion C of the substrate back surface 1b, and the second back conductive pads 10b may be disposed in an edge portion E of the substrate back surface 1b, which surrounds the central portion C in a plan view. Each of the redistribution patterns RP may connect at least two second back conductive pads 10b to each other. The redistribution pattern RP and the second back conductive pads 10b connected to the redistribution pattern RP may constitute a single body. Here, according to an embodiment, an interface does not exist between the redistribution pattern RP and the second back conductive pad 10b.

The plurality of first back conductive pads 10a may include signal pads configured to receive signal voltages, and the plurality of second back conductive pads 10b may include at least two dummy pads DP. The plurality of second back conductive pads 10b may further include at least two power pads PP configured to receive a power voltage, and at least two ground pads GP configured to receive a ground voltage. Each of the redistribution patterns RP may connect the at least two dummy pads DP, the at least two power pads PP, or the at least two ground pads GP.

The redistribution pattern RP may connect at least two second back conductive pads 10b disposed in a straight line. Alternatively, the redistribution pattern RP may connect at least two second back conductive pads 10b that are not disposed in a straight line. Alternatively, the redistribution pattern RP may have a polygonal shape to connect three or more second back conductive pads 10b disposed adjacent to each other.

For example, the redistribution patterns RP may include first to eighth redistribution patterns RP1 to RP8, as shown in FIG. 1.

The first redistribution pattern RP1 may connect two second back conductive pads 10b. Here, the two second back conductive pads 10b may be the dummy pads DP. The second redistribution pattern RP2 may connect three second back conductive pads 10b. Here, the three second back conductive pads 10b may be the power pads PP. The third redistribution pattern RP3 may connect four second back conductive pads 10b. Here, the four second back conductive pads 10b may be the ground pads GP. The first to third redistribution patterns RP1 to RP3 may extend in one direction.

The fourth redistribution pattern RP4 may have a triangle shape to connect three second back conductive pads 10b disposed adjacent to each other, and the fifth redistribution pattern RP5 may have a tetragonal shape to connect four second back conductive pads 10b disposed adjacent to each other. Here, the three second back conductive pads 10b and the four second back conductive pads 10b may be the dummy pads DP, the power pads PP, or the ground pads GP.

The sixth redistribution pattern RP6 may connect two second back conductive pads 10b disposed in a diagonal line. Here, the two second back conductive pads 10b may be the dummy pads DP, the power pads PP, or the ground pads GP.

The seventh redistribution pattern RP7 may connect two second back conductive pads 10b which are disposed in a straight line and are not disposed adjacent to each other. The seventh redistribution pattern RP7 may have a C-shape when viewed in a plan view. Here, the two second back conductive pads 10b that are not adjacent to each other may be the dummy pads DP, the power pads PP, or the ground pads GP.

The eighth redistribution pattern RP8 may connect two second back conductive pads 10b that are not disposed in a straight line. Here, the two second back conductive pads 10b that are not disposed in a straight line may be the dummy pads DP, the power pads PP, or the ground pads GP.

Referring to FIG. 3, the first redistribution pattern RP1 may have a first width W1. The width (e.g., first width) W1 of the first redistribution pattern RP1 may be less than a width W2 of the second back conductive pad 10b, as shown in FIG. 3. Alternatively, the width W1 of the first redistribution pattern RP1 may be about equal to the width W2 of the second back conductive pad 10b or may be greater than the width W2 of the second back conductive pad 10b. The first width W1 may range from about 10% to about 300% of the width W2 of the second back conductive pad 10b. The first redistribution pattern RP1 may have a first thickness T1. The first thickness T1 may be about 5 μm or less.

The second back conductive pad 10b may have a second width W2. The second width W2 may range from about 10 μm to about 100 μm. The second back conductive pad 10b may have a second thickness T2. The second thickness T2 may be about equal to the first thickness T1. The second thickness T2 may be about 5 μm or less.

Each of the first to fourth semiconductor chips 100a to 100d may further include a through-via 11 and a through-insulating layer 13. In each of the first to fourth semiconductor chips 100a to 100d, the through-via 11 may penetrate a portion of the second passivation layer 15, the substrate 1, and the interlayer insulating layer 3. The through-insulating layer 13 may be disposed between the through-via 11 and the substrate 1. A top surface of the through-via 11 may be in contact with the first back conductive pad 10a. A bottom surface of the through-via 11 may be in contact with one of the interconnection lines 5.

External connection terminals 160 may be bonded to the front conductive pads 7 of the first semiconductor chip 100a, respectively. Internal connection members 150 may be connected to the front conductive pads 7 of each of the second to fourth semiconductor chips 100b to 100d.

The fourth semiconductor chip 100d may exclude the through-via 11 and the through-insulating layer 13. A thickness of the substrate 1 included in the fourth semiconductor chip 100d may be greater than a thickness of the substrate 1 included in the second semiconductor chip 100b or the third semiconductor chip 100c. In addition, the fourth semiconductor chip 100d may exclude the second passivation layer 15 and the first and second back conductive pads 10a and 10b.

The first to fourth semiconductor chips 100a, 100b, 100c and 100d may be electrically connected to each other through the internal connection members 150. The internal connection members 150 may electrically connect the first and second back conductive pads 10a and 10b of a lower one of two adjacent semiconductor chips of the first to fourth semiconductor chips 100a, 100b, 100c and 100d to the front conductive pads 7 of an upper one of the two adjacent semiconductor chips. Underfill layers UF may be disposed between the first to fourth semiconductor chips 100a, 100b, 100c and 100d.

Each of the substrates 1 may be, for example, a single-crystalline silicon substrate or a silicon-on-insulator (SOI) substrate. Each of the interlayer insulating layers 3 may include a single layer or multi-layer including at least one of, for example, a silicon oxide layer, a silicon nitride layer, a silicon oxynitride layer, or a porous insulating layer. For example, the mold layer MD may include an insulating resin such as an epoxy molding compound (EMC). The mold layer MD may further include fillers, and the fillers may be dispersed in the insulating resin. For example, the fillers may include silicon oxide ($SiO_2$). The underfill layer UF may include, for example, a thermosetting resin or a photo-curable resin. In addition, the underfill layer UF may further include organic fillers or inorganic fillers.

The front conductive pads 7, the first back conductive pads 10a, the second back conductive pads 10b, the redistribution patterns RP, the internal connection members 150, the interconnection lines 5, the through-vias 11 and the external connection terminals 160 may include conductive materials (e.g., metals). For example, the interconnection lines 5 may include at least one of copper, tungsten, aluminum, ruthenium, titanium, tantalum, titanium nitride, or tantalum nitride. For example, the through-vias 11 may include tungsten.

The semiconductor package 1000 according to an embodiment may include the redistribution patterns RP disposed on back surfaces of the first to third semiconductor chips 100a to 100c. In a process of manufacturing the semiconductor package 1000 according to an embodiment, when the second semiconductor chip 100b is stacked on the first semiconductor chip 100a as shown in FIG. 4F, the internal connection members 150 disposed on a front surface of the second semiconductor chip 100b may be heated and bonded to the first and second back conductive pads 10a and 10b of the first semiconductor chip 100a. At this time, the internal connection members 150 and the interconnection lines 5 of a front portion of the second semiconductor chip 100b may include the metals, and thus may have a relatively great coefficient of thermal expansion. On the contrary, the substrate 1 may be formed of silicon, and thus may have a relatively small coefficient of thermal expansion. Warpage of the front portion of the second semiconductor chip 100b may occur by a difference between the coefficients of thermal expansion. However, according to embodiments of the inventive concept, the redistribution patterns RP including the metal may be disposed on the back surface of the second semiconductor chip 100b to increase a portion of the metal in a back portion of the second semiconductor chip 100b. As a result, a difference in coefficient of thermal expansion between the front portion and the back portion of the second semiconductor chip 100b may be reduced to minimize, reduce or prevent warpage of the second semiconductor chip 100b.

Similarly, when the third semiconductor chip 100c is stacked on the second semiconductor chip 100b, occurrence of warpage of a front portion of the third semiconductor chip 100c may be minimized, reduced or prevented by the redistribution patterns RP provided on the back surface of the third semiconductor chip 100c. As a result, reliability of the semiconductor package 1000 may be increased.

FIGS. 4A to 4G are cross-sectional views illustrating a method of manufacturing the semiconductor package of FIG. 2.

Figure 4A:
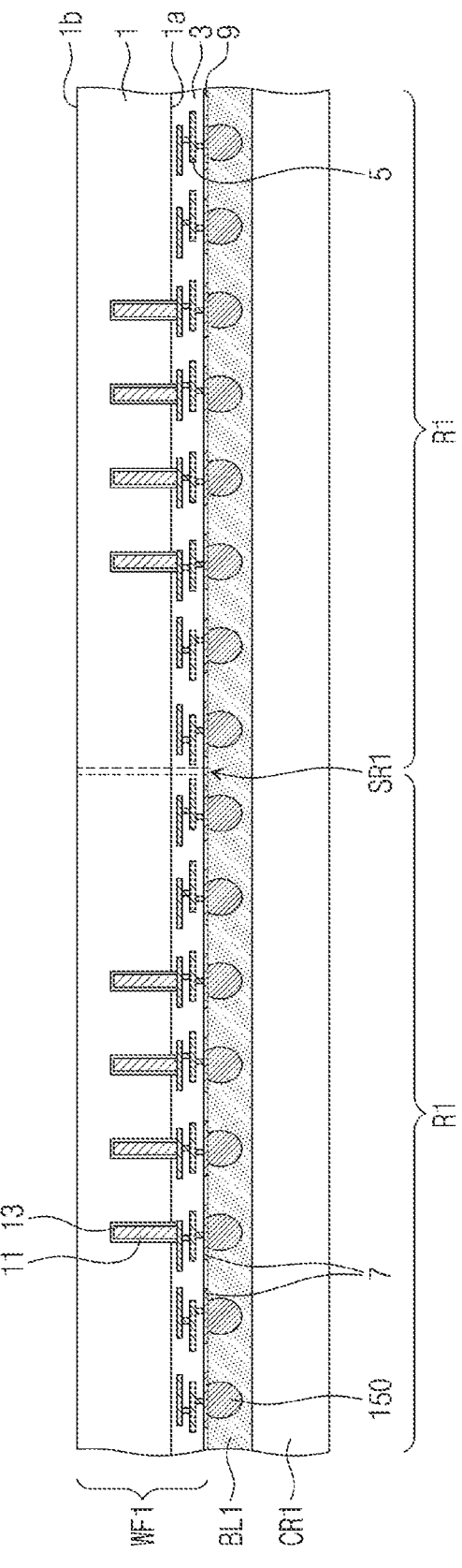
FIGS. 4A to 4G are cross-sectional views illustrating a method of manufacturing the semiconductor package of FIG. 2.

Referring to FIG. 4A, a first wafer structure WF1 may be prepared. The first wafer structure WF1 may have a plurality of first chip regions R1, and a first separation region SR1 disposed between the first chip regions R1. The first separation region SR1 may be a scribe lane region. The first wafer structure WF1 may include a substrate 1. The substrate 1 may have a substrate front surface 1a and a substrate back surface 1b, which are opposite to each other. Transistors and a portion of an interlayer insulating layer 3 covering the transistors may be formed on the substrate front surface 1a. The portion of the interlayer insulating layer 3 and the substrate 1 may be etched to form a through-hole, and a through-via 11 and a through-insulating layer 13 may be formed in the through-hole. Interconnection lines 5 connected to the through-via 11 and a remaining portion of the interlayer insulating layer 3 may be formed. Front conductive pads 7 and a first passivation layer 9 may be formed on the interlayer insulating layer 3. The first wafer structure WF1 may be disposed in such a way that the first passivation layer 9 faces downward and may be bonded to a first carrier substrate CR1 with a first adhesive layer BL1 interposed therebetween. The first adhesive layer BL1 may include, for example, an adhesive/thermosetting/thermoplastic/photo-curable resin.

Figure 4B:
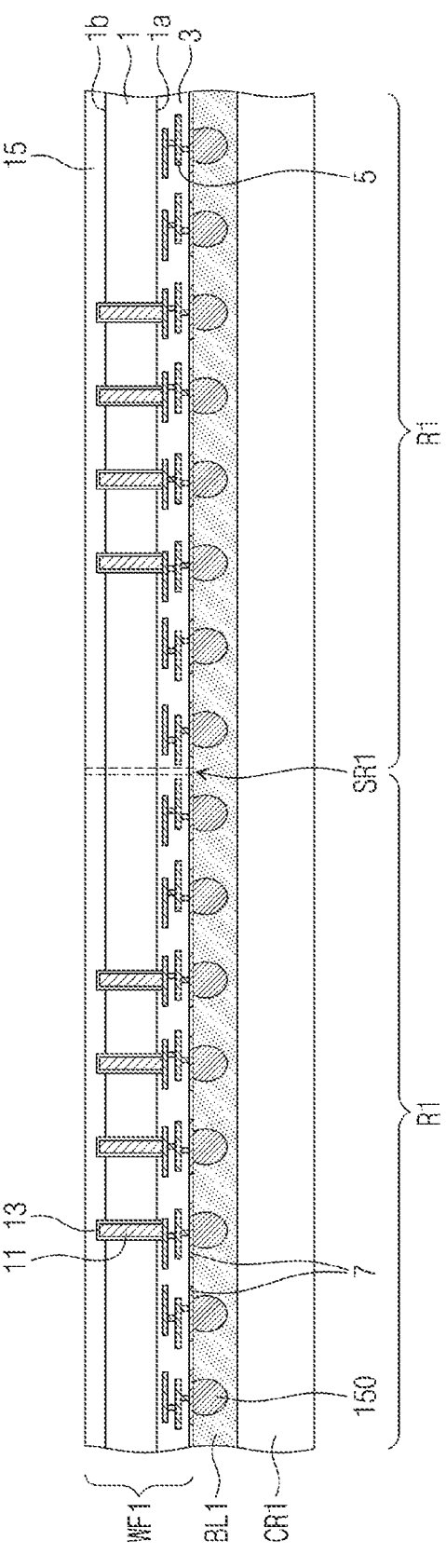

Referring to FIG. 4B, a grinding or etch-back process may be performed on the substrate back surface 1*b* of the substrate 1, and thus, a portion of the substrate 1 may be removed to expose the through-insulating layer 13. At this time, the substrate back surface 1*b* may be lower than a top end of the through-via 11. In other words, a thickness of the substrate 1 may be reduced by the grinding process. The through-via 11 may protrude above the substrate back surface 1*b*. A second passivation layer 15 may be formed on the substrate back surface 1*b*.

Figure 4C:
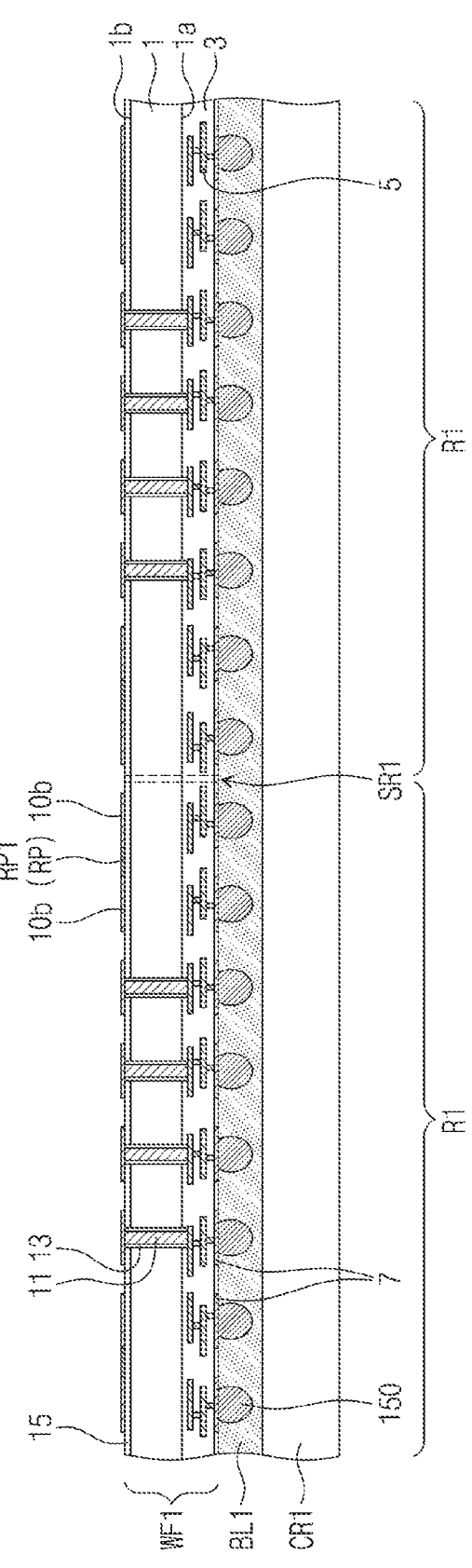

Referring to FIG. 4C, a CMP or etch-back process may be performed to remove a portion of the second passivation layer 15 and a portion of the through-insulating layer 13, and thus, the through-vias 11 may be exposed. First back conductive pads 10*a*, second back conductive pads 10*b* and redistribution patterns RP may be formed on the second passivation layer 15 at the same time. The first back conductive pads 10*a*, the second back conductive pads 10*b* and the redistribution patterns RP may be formed by forming and etching a conductive layer. Alternatively, the first back conductive pads 10*a*, the second back conductive pads 10*b* and the redistribution patterns RP may be formed using a plating process. The first back conductive pads 10*a* may be formed to be in contact with the through-vias 11. In other words, the first back conductive pads 10*a* may be formed in a central portion C (see FIG. 2) of the substrate 1. The second back conductive pads 10*b* and the redistribution patterns RP may be formed in an edge portion E (see FIG. 2) of the substrate 1.

Figure 4D:
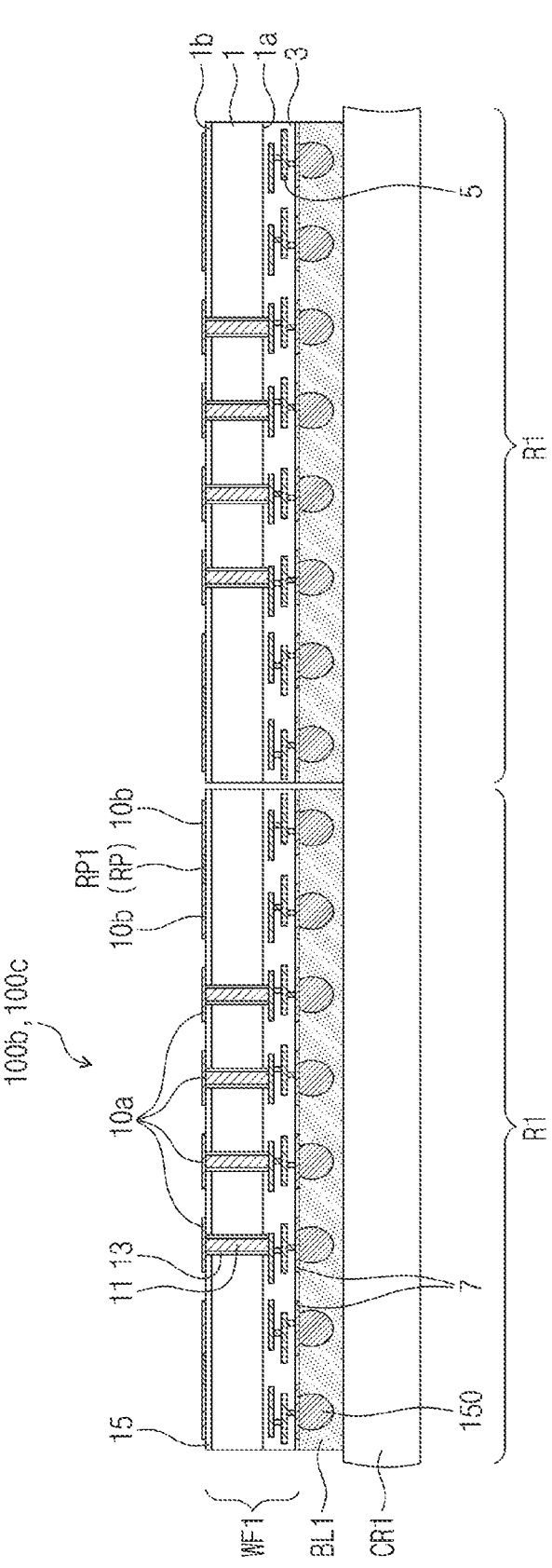

Referring to FIG. 4D, a dicing process using a laser may be performed to remove the first separation region SR1 of the first wafer structure WF1, thereby forming a plurality of semiconductor chips 100*b* and 100*c*. Thus, the second and third semiconductor chips 100*b* and 100*c* of FIG. 1 may be formed. Thereafter, the second and third semiconductor chips 100*b* and 100*c* may be separated from the first adhesive layer BL1.

The fourth semiconductor chip 100*d* of FIG. 1 may be formed by performing the dicing process without the formation of the through-via 11 and the through-insulating layer 13 in the first wafer structure WF1. The grinding process of reducing the thickness of the substrate 1 in the first wafer structure WF1 may also be omitted.

Figure 4E:
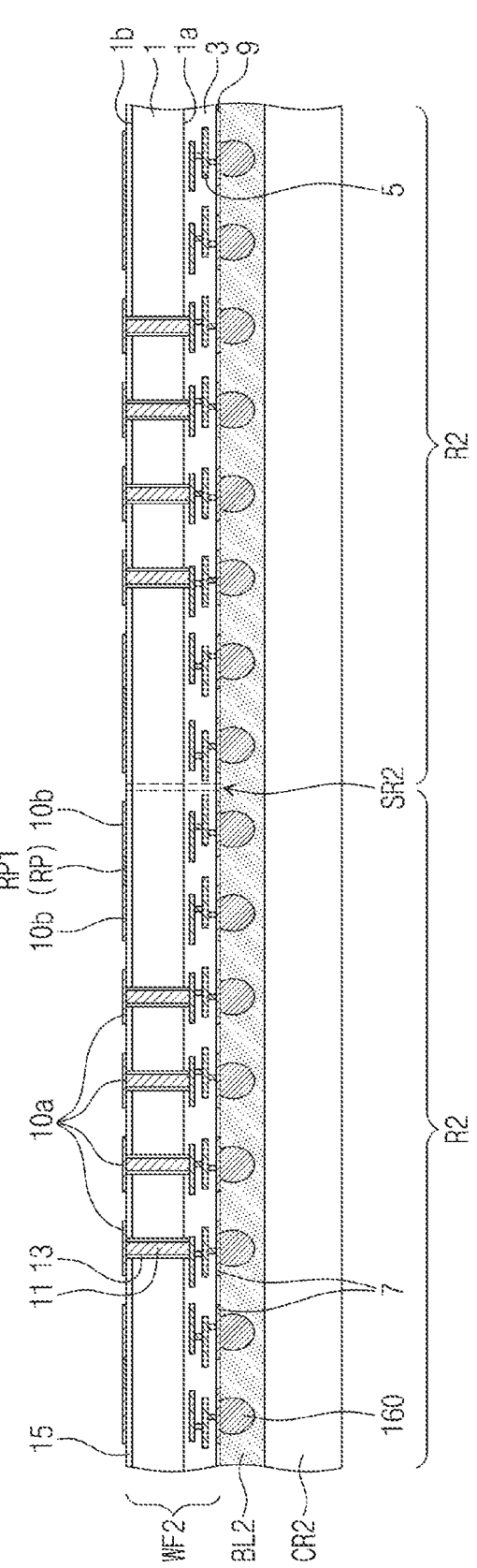
Figure 4F:
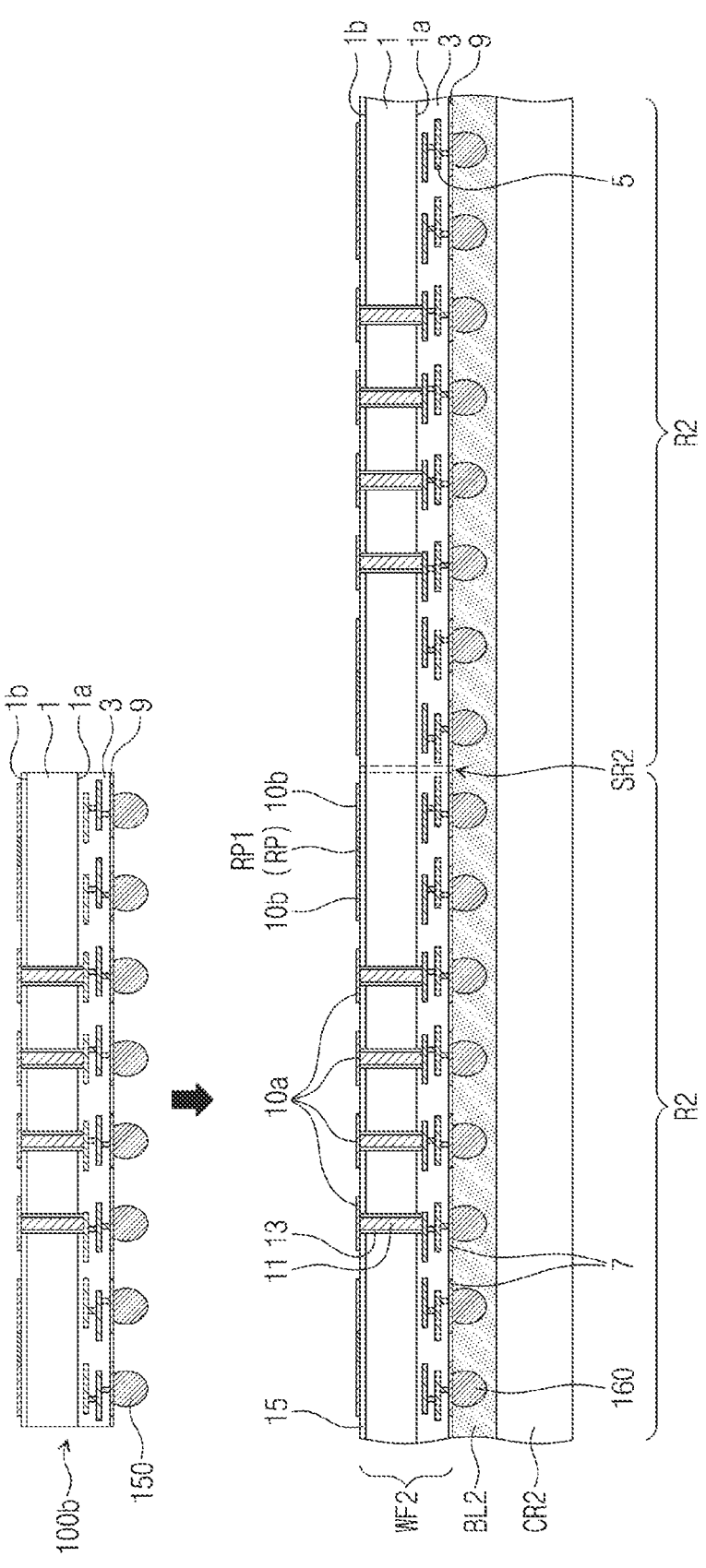

Referring to FIG. 4E, a second wafer structure WF2 may be prepared. The second wafer structure WF2 may have a plurality of second chip regions R2, and a second separation region SR2 disposed between the second chip regions R2. The second separation region SR2 may be a scribe lane region. The second wafer structure WF2 may include a substrate 1. Each of the second chip regions R2 may include the structure of the first semiconductor chip 100*a* described with reference to FIG. 1. First back conductive pads 10*a*, second back conductive pads 10*b* and redistribution patterns RP may be formed on the substrate back surface 1*b*. External connection terminals 160 may be formed on the front conductive pads 7 located at a bottom surface of the second wafer structure WF2. The second wafer structure WF2 may be bonded to a second carrier substrate CR2 with a second adhesive layer BL2 interposed therebetween. The second adhesive layer BL2 may include, for example, an adhesive/thermosetting/thermoplastic/photo-curable resin.

Referring to FIG. 4F, the second to fourth semiconductor chips 100*b*, 100*c* and 100*d* may be stacked on the second chip region R2 of the second wafer structure WF2. At this time, the internal connection members 150 of the second semiconductor chip 100*b* may be bonded to the first back conductive pads 10*a* and the second back conductive pads 10*b* of the second wafer structure WF2. The internal connection members 150 of the third semiconductor chip 100*c* may be bonded to the first back conductive pads 10*a* and the second back conductive pads 10*b* of the second semiconductor chip 100*b*. The internal connection members 150 of the fourth semiconductor chip 100*d* may be bonded to the first back conductive pads 10*a* and the second back conductive pads 10*b* of the third semiconductor chip 100*c*.

At this time, the second and third semiconductor chips 100*b* and 100*c* may be located in such a way that the through-vias 11 of the first to third semiconductor chips 100*a*, 100*b* and 100*c* are aligned with each other.

In the state of FIG. 4F, a thermal compression process may be performed to bond the internal connection members 150 of each of the second to fourth semiconductor chips 100*b* to 100*d* to the first back conductive pads 10*a* and the second back conductive pads 10*b* of the semiconductor chip located directly thereunder. For example, the thermal compression process may be performed at a temperature of about 360 degrees Celsius or more. Warpage of the substrate front surface 1*a* of each of the second to fourth semiconductor chips 100*b* to 100*d* may typically occur by the thermal compression process, but the redistribution patterns RP may be formed on the substrate back surface 1*b* of each of the second to fourth semiconductor chips 100*b* to 100*d* to minimize, reduce or prevent the warpage.

Figure 4G:
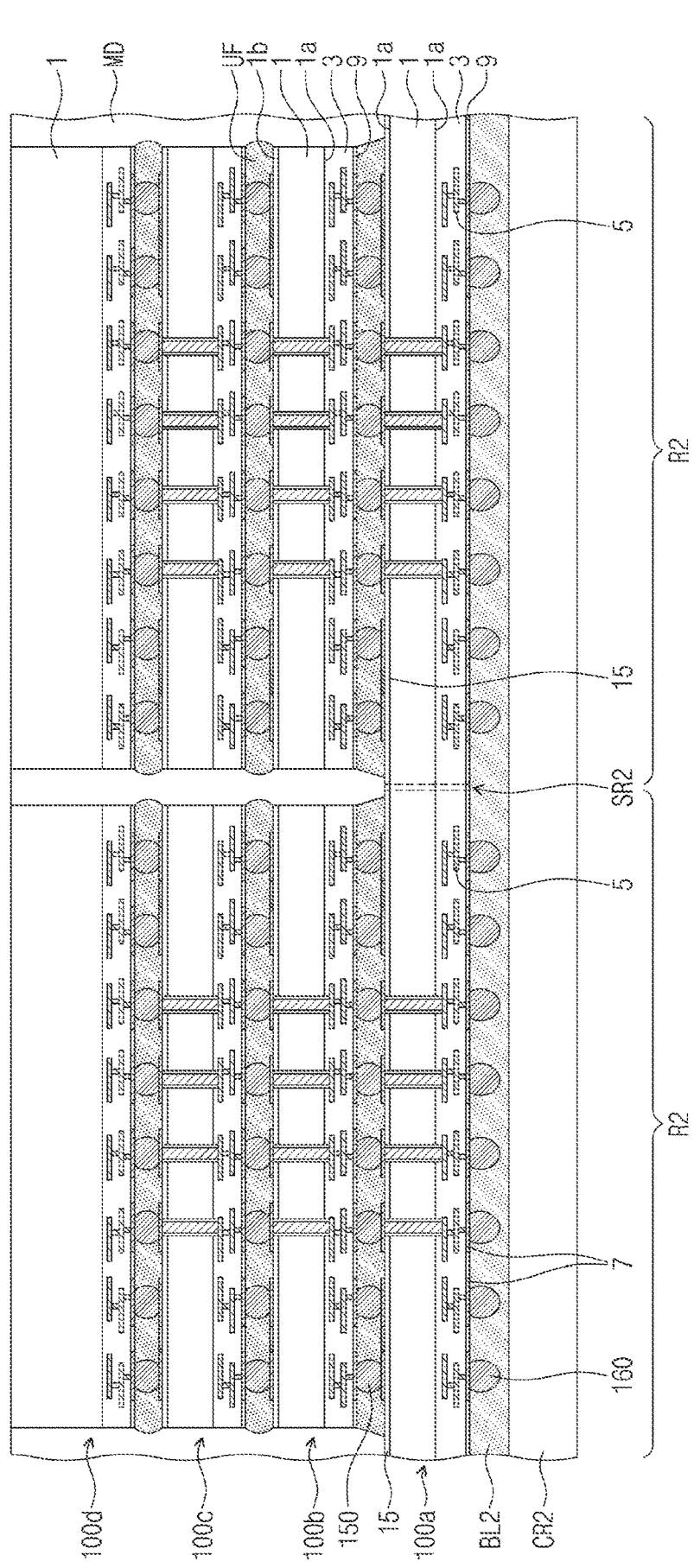

Referring to FIG. 4G, after the thermal compression process is performed to bond the second to fourth semiconductor chips 100*b*, 100*c* and 100*d*, a molding process may be performed to form a mold layer MD covering a top surface of the second wafer structure WF2 and side surfaces of the second to fourth semiconductor chips 100*b*, 100*c* and 100*d*. Thereafter, a dicing process using a laser may be performed to remove the second wafer structure WF2 and the mold layer MD of the second separation region SR2, thereby manufacturing a plurality of semiconductor packages (see 1000 of FIG. 2). Subsequently, the semiconductor packages 1000 may be separated from the second adhesive layer BL2.

In a method of manufacturing a semiconductor package according to embodiments of the inventive concept, the redistribution patterns may be provided on the back surface of the semiconductor chip, and thus, process failure of the semiconductor chip may be prevented or reduced. As a result, a yield and reliability of the semiconductor package may be increased.

A semiconductor package according to embodiments of the inventive concept may include the redistribution patterns provided on the back surface of the semiconductor chip, and thus, embodiments may prevent or reduce warpage of the front surface of the semiconductor chip from occurring by the high coefficient of thermal expansion of the interconnection lines and the internal connection members disposed on the front surface of the semiconductor chip when the semiconductor chip is stacked. As a result, the reliability of the semiconductor package may be increased.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A semiconductor package, comprising:
a plurality of semiconductor chips stacked sequentially,
wherein each of the plurality of semiconductor chips comprises:
a substrate comprising a back surface and a front surface which are opposite to each other;
a plurality of first back conductive pads disposed on the back surface;
a plurality of second back conductive pads disposed on the back surface;
a redistribution pattern disposed on the back surface and disposed between the plurality of second back conductive pads and connects at least two second back conductive pads to each other; and
wherein the plurality of second back conductive pads comprises:
at least two dummy pads;
at least two power pads configured to receive a power voltage; and
at least two ground pads configured to receive a ground voltage,
wherein the redistribution pattern connects the at least two dummy pads to each other,
the at least two power pads to each other, or the at least two ground pads to each other.

2. The semiconductor package of claim 1, wherein the plurality of first back conductive pads is disposed in a central portion of the back surface, and wherein the plurality of second back conductive pads is disposed in an edge portion of the back surface, which surrounds the central portion in a plan view.

3. The semiconductor package of claim 1, wherein the plurality of first back conductive pads comprises a signal pad configured to receive a signal voltage.

4. The semiconductor package of claim 1, wherein the redistribution pattern connects the at least two second back conductive pads disposed in a straight line.

5. The semiconductor package of claim 1, wherein the redistribution pattern has a polygonal shape and connects three or more second back conductive pads disposed adjacent to each other.

6. The semiconductor package of claim 1, wherein a width of the redistribution pattern ranges from about 10% to about 300% of a width of at least one of the second back conductive pads, and
wherein a thickness of the redistribution pattern is about 5 μm or less.

7. The semiconductor package of claim 1, wherein a width of at least one of the second back conductive pads ranges from about 10 μm to about 100 μm.

8. The semiconductor package of claim 1, wherein each of the semiconductor chips further comprises:
a through-via penetrating the substrate and being in contact with each of the first back conductive pads.

9. A semiconductor package, comprising:
a plurality of semiconductor chips stacked sequentially,
wherein each of the plurality of semiconductor chips comprises:

a substrate comprising a back surface and a front surface which are opposite to each other;
a plurality of first back conductive pads disposed on the back surface;
a plurality of second back conductive pads disposed on the back surface;
a redistribution pattern disposed on the back surface and connects at least two second back conductive pads of the plurality of second back conductive pads;
a through-via penetrating the substrate and being in contact with each of the first back conductive pads; and
wherein the plurality of second back conductive pads comprises:
at least two dummy pads;
at least two power pads configured to receive a power voltage; and
at least two ground pads configured to receive a ground voltage,
wherein the redistribution pattern connects the at least two dummy pads to each other,
the at least two power pads to each other, or the at least two ground pads to each other.

10. The semiconductor package of claim 9, wherein each of the semiconductor chips further comprises:
a plurality of interconnection lines disposed on the front surface;
an interlayer insulating layer covering the interconnection lines; and
a plurality of front conductive pads disposed under the interlayer insulating layer.

11. The semiconductor package of claim 9, wherein the plurality of first back conductive pads is disposed in a central portion of the back surface, and
wherein the plurality of second back conductive pads is disposed in an edge portion of the back surface, which surrounds the central portion in a plan view.

12. The semiconductor package of claim 9, wherein the plurality of first back conductive pads comprises a signal pad configured to receive a signal voltage.

13. The semiconductor package of claim 9, wherein the at least two second back conductive pads are disposed in a straight line.

14. The semiconductor package of claim 9, wherein the redistribution pattern has a polygonal shape and connects three or more second back conductive pads disposed adjacent to each other.

15. The semiconductor package of claim 9, wherein a width of the redistribution pattern ranges from about 10% to about 300% of a width of at least one of the second back conductive pads,
wherein a thickness of the redistribution pattern is about 5 μm or less, and
wherein the width of the at least one of the second back conductive pads ranges from about 10 μm to about 100 μm.

16. A semiconductor package, comprising:
a plurality of semiconductor chips stacked sequentially;
an underfill layer disposed between the plurality of semiconductor chips; and
a mold layer covering the plurality of semiconductor chips,
wherein each of the plurality of semiconductor chips comprises:
a substrate comprising a back surface and a front surface which are opposite to each other;
a plurality of first back conductive pads disposed on the back surface;

a plurality of second back conductive pads disposed on the back surface;

a redistribution pattern disposed on the back surface and connects at least two second back conductive pads of the plurality of second back conductive pads;

a through-via penetrating the substrate and being in contact with each of the first back conductive pads;

a plurality of interconnection lines disposed on the front surface;

an interlayer insulating layer covering the interconnection lines;

a plurality of front conductive pads disposed under the interlayer insulating layer; and a plurality of internal connection members bonded to the front conductive pads, wherein a width of the redistribution pattern ranges from about 10% to about 300% of a width of at least one of the second back conductive pads, wherein a thickness of the redistribution pattern is about 5 μm or less, and wherein the width of the at least one of the second back conductive pads ranges from about 10 μm to about 100 μm; and wherein the plurality of second back conductive pads comprises:

at least two dummy pads;

at least two power pads configured to receive a power voltage; and at least two ground pads configured to receive a ground voltage, wherein the redistribution pattern connects the at least two dummy pads to each other, the at least two power pads to each other, or the at least two ground pads to each other.

\* \* \* \* \*